United States Patent [19]

Albrecht

[11] Patent Number: 4,528,163
[45] Date of Patent: Jul. 9, 1985

[54] CRUCIBLE FOR SEMICONDUCTOR MANUFACTURING PURPOSES AND A PROCESS FOR MANUFACTURING THE CRUCIBLE

[75] Inventor: Horst Albrecht, Hanau, Fed. Rep. of Germany

[73] Assignee: Heraeus Quarzschmelze GmbH, Fed. Rep. of Germany

[21] Appl. No.: 345,515

[22] Filed: Feb. 4, 1982

Related U.S. Application Data

[63] Continuation of Ser. No. 156,726, Jun. 5, 1980, abandoned.

[30] Foreign Application Priority Data

Jul. 12, 1979 [DE] Fed. Rep. of Germany ....... 2928089

[51] Int. Cl.³ .............................................. C30B 15/10
[52] U.S. Cl. ........................... 422/249; 156/DIG. 83; 432/264
[58] Field of Search ............... 422/102, 240, 241, 248, 422/249; 432/264, 265; 156/DIG. 83

[56] References Cited

U.S. PATENT DOCUMENTS

| 1,241,971 | 10/1917 | Henderson | 432/265 |
| 3,240,568 | 3/1966 | Derby et al. | 156/DIG. 83 |
| 4,010,064 | 3/1977 | Patrick et al. | 156/DIG. 83 |

FOREIGN PATENT DOCUMENTS

| 962868 | 4/1957 | Fed. Rep. of Germany | 422/248 |
| 1051806 | 3/1959 | Fed. Rep. of Germany | 156/DIG. 83 |
| 493033 | 9/1938 | United Kingdom | 432/264 |

OTHER PUBLICATIONS

Encyclopedia of Chemical Technology, vol. 18, 2nd Ed., 1969, John Wiley, pp. 73–77.

Primary Examiner—Hiram H. Bernstein
Attorney, Agent, or Firm—Sprung Horn Kramer & Woods

[57] ABSTRACT

A crucible for semiconductor technology purposes, especially for the production of silicon crystals, comprising an outer layer portion or layer of silicon dioxide, especially an outer made from granular natural quartz, and an inner lining made from synthetic crystalline quartz is described. The inner lining has on its interior surface a thin amorphous layer suitably made by heating a synthetic quartz layer disposed over a granular natural quartz layer at a sufficient temperature for a sufficient period of time to convert at least a portion of the synthetic crystalline quartz to the amorphous state.

8 Claims, 3 Drawing Figures

CRUCIBLE FOR SEMICONDUCTOR MANUFACTURING PURPOSES AND A PROCESS FOR MANUFACTURING THE CRUCIBLE

This is a continuation of application Ser. No. 156,726, filed June 5, 1980, now abandoned.

BACKGROUND OF THE INVENTION

1. Field of the Invention

The invention relates to a crucible for semiconductor manufacturing purposes, especially for the production of silicon crystals, consisting of an outer shell containing silicon dioxide and having an inner lining consisting of synthetically made silicon dioxide, permanently joined to the shell.

2. Discussion of Prior Art

Crucibles of the above-described kind are known from German Pat. No. 962,868. These crucibles are used for the pulling of monocrystals, especially of silicon. The crucible consists of two parts bonded permanently together. The outer part, or shell, of the crucible consists of high-purity quartz. This shell is provided with a lining of silicon dioxide which is obtained by the rectification of silicon tetrachloride followed by hydrolysis with high-purity water. The gel-like mass formed by this process is applied to the inside of the shell on which it is then sintered at about 1200° to 1400° C. The lining of the crucible thus constructed is porous, thereby creating the danger that the semiconductor from which the monocrystal is to be pulled might be held in the pores, thus interfering considerably with the pulling process. Also, portions of the lining may flake away from the outer shell, contaminating the melt of semi-conductor material and rendering it unusable.

SUMMARY OF THE INVENTION

It is an object of the invention to provide a crucible for semiconductor manufacturing purposes, especially for the production of silicon crystals, which has a pore-free, smooth and resistant lining of high-purity material which can be produced at low cost in any desired thickness suitable for the purpose for which the crucible is to be used.

This object is achieved in accordance with the invention, in a crucible of the kind described above, by making the lining from granulated synthetic crystalline quartz as the starting material such that the lining has at least a thin, amorphous layer beginning at the exposed, free surface of the lining. The outer shell of the crucible comprises a silicon dioxide containing outer layer and is preferably made from granules of natural quartz. It contains a large number of small air bubbles.

The thickness of the lining ranges from 5 to 60 percent of the total wall thickness of the crucible. Preferably it ranges from 20 to 30 percent of the total wall thickness of the crucible. Crucibles in which at least one-tenth of the thickness of the lining is in the amorphous state have proven especially advantageous.

It has furthermore been found desirable to make the thickness of the lining greater in the bottom part of the crucible than in the cylindrical part adjoining same.

Crucibles of the invention have the advantage that molten semiconductor material cannot stick to the smooth surface of the lining as it can in the case of the known, porous linings. Only the lining is made of synthetic quartz, not the shell of the crucible, for whose manufacture granulated natural quartz can be used.

The lining and the outer shell are homogeneously bonded together at their interfaces, thereby reducing the danger of the spalling off of portions of the lining to a negligible level. On account of the relatively great thickness of the lining, crucibles of the invention can be used for several cycles of semiconductor crystal production, in contrast to known crucibles provided with only a thin interior coating.

The crucible of the invention can be made by initially forming a shell made of natural crystalline quartz. This shell can be made by disposing natural crystalline quartz in a rotating form. The natural crystalline quartz forms a layer on the inside wall of the form. Then synthetic crystalline quartz is poured in and deposited in a layer on the layer of natural crystalline quartz formed. Heat is applied while continuing the mold rotation in amount sufficient to bond the respective layers together. This heat also transforms at least a portion of the synthetic crystalline quartz layer to the amorphous state. The transformation begins at the exposed surface of the synthetic crystalline quartz layer. Generally the synthetic crystalline quartz layer is heated at 2000° to 2500° C. for at least 0.1 hours, preferably 2200° to 2400° C. for 0.1 to 0.2 hours. Preferably at least 10 percent by weight and more preferably 50 to 100 percent by weight of the synthetic crystalline quartz of the layer is converted to the amorphous state.

The process has the advantage that the crucible of the invention can be produced in a single working procedure. This is substantially preferable both cost-wise and energy-wise to processes in which the interior coating is produced by an after-treatment of a previously produced crucible, which involves more work.

BRIEF DESCRIPTION OF DRAWINGS

The invention will be described below in conjunction with FIGS. 1 and 3, wherein.

DESCRIPTION OF SPECIFIC EMBODIMENT

The reference number 1 indicates the outer shell of the crucible, which is made from granulated natural quartz. The shell is permanently bonded to the inner lining 2 which has the amorphous layer 3. The layer 3 has a thickness which amounts to a least one-tenth of the thickness of the lining. The thickness of the lining is equal in the bottom and cylindrical portion in FIG. 1. The outer shell can contain a great number of small air bubbles which will in no way impair the use of the crucible, because of the amorphous layer 3.

Figure 3:
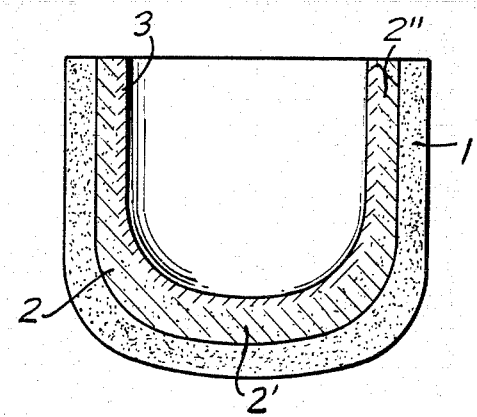
FIG. 3 shows a vertical section through a crucible in another development.

The crucible represented in FIG. 3 differs from the one in FIG. 4 in that the thickness of the bottom part 2" of the lining is greater than the thickness of the cylindrical part 2" of the lining 2.

Figure 2:
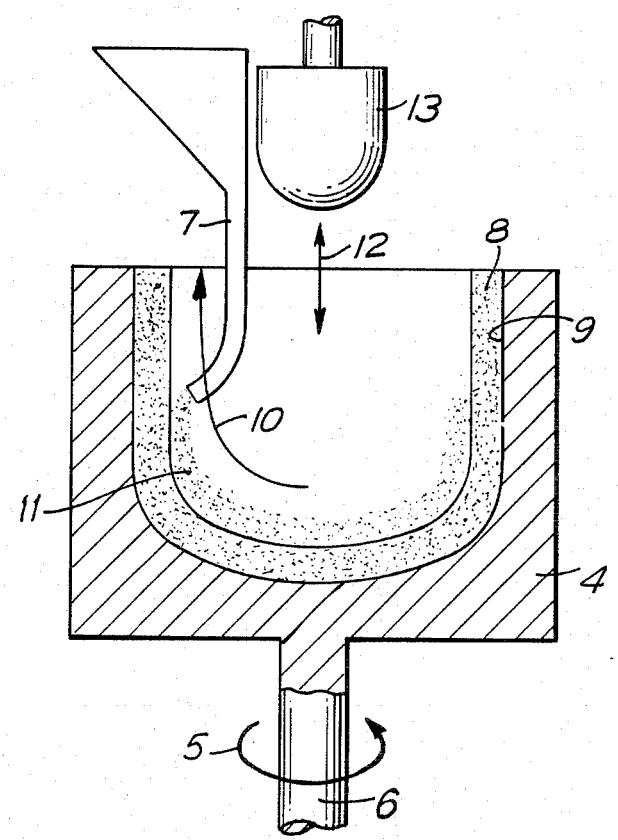
FIG. 2 shows diagrammatically, partially in vertical cross-section, the production of a crucible.

The process of manufacturing a crucible of the invention will be explained hereinafter in conjunction with FIG. 2. First, granulated natural quartz is poured through the tube 7 of a feeding means into a mold 4 which, as indicated by the arrow 5, rotates about the axis 6, and it is deposited in uniform thickness on the inner wall 9 of the mold 4. The feeding tube 7 is at the same time slowly raised upwardly, as indicated by arrow 10, from the bottom of mold 4 into its cylindrical portion. The speed of rotation of mold 4 is to be made so high that the granules fed into it will not drop to its bottom but will be pressed by the centrifugal force against the interior surface of the mold.

When the depositing of the granulated natural quartz has been completed, the granulated synthetic crystalline quartz 11 is poured into the mold in the same manner as the granulated natural quartz 8 through the feeding tube 7, without interrupting the rotation of the mold 4, and it is deposited over the granules 8. When this procedure has been completed, the heat source 13 is advanced into the mold as indicated by arrow 12, while sustaining the rotation. The interior space of the mold 4 is heated by this heat source to such an extent that its temperature is raised above the melting point of the granules 11.

Figure 1:
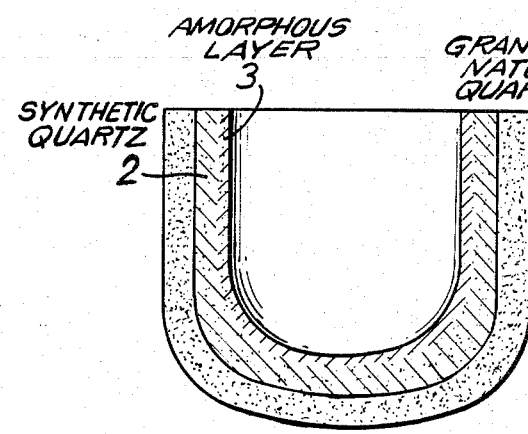
FIG. 1 shows a vertical section through a crucible.

In this manner not only are the individual particles of the granulated quartz bonded together, but the different quartz materials are homogeneously bonded together at their interface, which is probably to be attributed to the similar crystalline structure of the two granulated materials. The innermost layer of granulated material 11 facing the heat source is furthermore transformed to the amorphous state with a very smooth surface, thus forming the stratum 3 (FIG. 1).

Through the selection of the rate of feed of the granulated quartz crystalline material, by varying the rate of movement of the feed tube 7 in the direction of arrow 10, for example, the thickness of the layers of materials 8 and 11 can be varied in any desired manner. This has the advantage that, for one thing, the thickness of the inner lining can easily be adapted to the many different requirements of the semiconductor manufacturing process.

What is claimed:

1. A crucible for semiconductor technological purposes, especially for the production of silicon crystals comprising a silicon dioxide containing outer layer, an inner layer homogeneously bonded to the outer layer at their interface and comprising synthetic crystalline quartz, said inner layer in turn having on its surface opposed from the silicon dioxide-containing outer layer, an exposed smooth surface consisting essentially entirely of amorphous fused silica.

2. A crucible according to claim 1, wherein the combined thickness of the amorphous layer and the layer made of synthetic crystalline quartz amounts to between 5 and 60 percent of the total wall thickness of the crucible.

3. A crucible according to claim 2, wherein said combined thickness amounts to 20 to 30 percent of the total wall thickness of the crucible.

4. A crucible according to claim 1, wherein the thickness of the amorphous layer amounts to at least 1/10th of the thickness of the inner layer.

5. A crucible according to claim 1, wherein the inner layer's thickness at the bottom portion of the crucible is greater than its thickness on the sidewalls of said crucible.

6. A crucible according to claim 2, wherein the amorphous layer's thickness amounts to at least 1/10th the thickness of the inner layer.

7. A crucible according to claim 3, wherein the inner layer's thickness at the bottom portion of the crucible is greater than its thickness on the sidewalls of said crucible.

8. A crucible according to claim 6, wherein the inner layer's thickness at the bottom portion of the crucible is greater than its thickness on the sidewalls of said crucible.

* * * * *

UNITED STATES PATENT AND TRADEMARK OFFICE
CERTIFICATE OF CORRECTION

PATENT NO. : 4,528,163
DATED : July 9, 1985
INVENTOR(S) : Horst Albrecht

It is certified that error appears in the above-identified patent and that said Letters Patent is hereby corrected as shown below:

Col. 4, line 27        Delete "according to claim 3" and substitute --according to claim 2--

Signed and Sealed this

Twenty-sixth Day of November 1985

[SEAL]

Attest:

DONALD J. QUIGG

Attesting Officer      Commissioner of Patents and Trademarks